(12) United States Patent
Hwang et al.

(10) Patent No.: US 9,478,706 B2
(45) Date of Patent: Oct. 25, 2016

(54) SEMICONDUCTOR LIGHT EMITTING DEVICE, NITRIDE SEMICONDUCTOR WAFER, AND METHOD FOR MANUFACTURING NITRIDE SEMICONDUCTOR LAYER

(71) Applicant: KABUSHIKI KAISHA TOSHIBA, Tokyo (JP)

(72) Inventors: Jongil Hwang, Kanagawa-ken (JP); Tomonari Shioda, Kanagawa-ken (JP); Hung Hung, Kanagawa-ken (JP); Naoharu Sugiyama, Kanagawa-ken (JP); Shinya Nunoue, Chiba-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/326,065

(22) Filed: Jul. 8, 2014

(65) Prior Publication Data

US 2014/0319457 A1     Oct. 30, 2014

Related U.S. Application Data

(62) Division of application No. 13/218,909, filed on Aug. 26, 2011, now Pat. No. 8,809,101.

(30) Foreign Application Priority Data

May 16, 2011   (JP) .................... 2011-109783

(51) Int. Cl.
*H01L 21/00*     (2006.01)
*H01L 33/32*     (2010.01)
(Continued)

(52) U.S. Cl.
CPC .......... *H01L 33/32* (2013.01); *H01L 33/0066* (2013.01); *H01L 33/0075* (2013.01); *H01L 33/06* (2013.01); *H01L 33/325* (2013.01); *H01L 33/007* (2013.01); *H01L 33/08* (2013.01)

(58) Field of Classification Search
CPC ........ H01L 33/22; H01L 33/30; H01L 33/32
USPC ......... 257/79, 86, 13, E21.603, 103; 438/69, 438/72, 77, 93
See application file for complete search history.

(56) References Cited

U.S. PATENT DOCUMENTS

| 7,915,626 B1 | 3/2011 | Allerman et al. |
| 2010/0258814 A1 | 10/2010 | Hoshi et al. |

(Continued)

FOREIGN PATENT DOCUMENTS

| JP | 11-330554 | 11/1999 |
| JP | 2002-261395 | 9/2002 |

(Continued)

OTHER PUBLICATIONS

Office Action issued Jan. 10, 2012 in Japan Application No. 2011-109783 (With English Translation).

(Continued)

*Primary Examiner* — Julia Slutsker
(74) *Attorney, Agent, or Firm* — Oblon, McClelland, Maier & Neustadt, L.L.P.

(57) ABSTRACT

According to one embodiment, a semiconductor light emitting device includes: first and second semiconductor layers, a light emitting part, and an In-containing layer. The first semiconductor layer is formed on a silicon substrate via a foundation layer. The light emitting part is provided on the first semiconductor layer, and includes barrier layers and a well layer provided between the barrier layers including $Ga_{1-z1}In_{z1}N$ ($0 < z1 \le 1$). The second semiconductor layer is provided on the light emitting part. The In-containing layer is provided at at least one of first and second positions. The first position is between the first semiconductor layer and the light emitting part. The second position is between the second semiconductor layer and the light emitting part. The In-containing layer includes In with a composition ratio different from the In composition ratio z1 and has a thickness 10 nm to 1000 nm.

23 Claims, 11 Drawing Sheets

(51) Int. Cl.
*H01L 33/06* (2010.01)
*H01L 33/00* (2010.01)
*H01L 33/08* (2010.01)

(56) References Cited

U.S. PATENT DOCUMENTS

| | | | |
|---|---|---|---|
| 2011/0220867 A1* | 9/2011 | Khan | H01L 21/02458 257/13 |
| 2011/0278537 A1* | 11/2011 | Lee | H01L 31/03046 257/13 |
| 2011/0284824 A1 | 11/2011 | Liu et al. | |
| 2012/0126239 A1 | 5/2012 | Keller et al. | |
| 2012/0126293 A1 | 5/2012 | Sumiya et al. | |
| 2012/0161099 A1 | 6/2012 | Jiang et al. | |
| 2012/0298964 A1 | 11/2012 | Peter et al. | |

FOREIGN PATENT DOCUMENTS

| | | |
|---|---|---|
| JP | 2008-103665 | 5/2008 |
| JP | 2008-270805 | 11/2008 |
| JP | 2009-64978 | 3/2009 |
| JP | 2009-158804 | 7/2009 |
| WO | WO 2005/034301 A1 | 4/2005 |
| WO | WO 2011/016304 A1 | 2/2011 |

OTHER PUBLICATIONS

Baijun Zhang, et al., "High-Bright InGaN Multiple-Quantum-Well Blue Light-Emitting Diodes on Si (111) Using AlN/GaN Multilayers with a Thin AlN/AlGaN Buffer Layer", Japanese Journal of Applied Physics Part 2, vol. 42, No. 3A, 2003, pp. L226-L228.
Japanese Office Action Issued Jun. 20, 2012 in Patent Application No. 2011-109783 (with English translation).
Office Action mailed Jun. 24, 2013, in Japanese Patent Application No. 2012-053347 (with English-language translation).
Office Action issued on Jan. 6, 2014 in the counterpart Japanese Patent Application No. 2012-053347 (with English Translation).

* cited by examiner

SEMICONDUCTOR LIGHT EMITTING DEVICE, NITRIDE SEMICONDUCTOR WAFER, AND METHOD FOR MANUFACTURING NITRIDE SEMICONDUCTOR LAYER

CROSS-REFERENCE TO RELATED APPLICATIONS

This application is a divisional application of and claims the benefit of priority under 35 U.S.C. §120 from U.S. application Ser. No. 13/218,909, filed Aug. 26, 2011, which is based upon and claims the benefit of priority under 35 U.S.C. §119 from the prior Japanese Patent Application No. 2011-109783, filed on May 16, 2011; the entire contents of each of which is incorporated herein by reference.

FIELD

Embodiments described herein relate generally to a semiconductor light emitting device, a nitride semiconductor wafer, and a method for manufacturing a nitride semiconductor layer.

BACKGROUND

In semiconductor devices using nitride semiconductors such as LDs (Laser Diodes) LEDs (Light Emitting Diodes) and HEMT (High Electron Mobility Transistors), there is a demand for suppressing deterioration and breakage of a nitride semiconductor layer during processes from crystal growth to packaging.

For example, when the nitride semiconductor layer is grown on a silicon substrate, there are proposed various structures such as a structure in which composition is continuously inclined and a superlattice structure in which two layers with different compositions are alternately stacked. However, the conventional methods are insufficient in terms of suppression of deterioration and breakage of the nitride semiconductor layer, and thus the methods have room for improvement.

DETAILED DESCRIPTION

Figure 1:
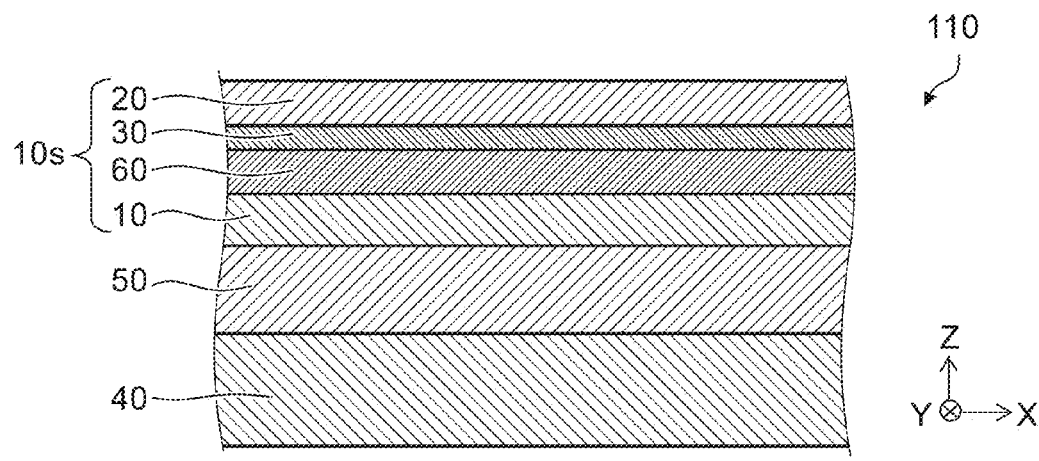
FIG. 1 is a schematic cross-sectional view showing a semiconductor light emitting device according to a first embodiment.

In general, according to one embodiment, a semiconductor light emitting device includes: a first semiconductor layer, a second semiconductor layer, and an In-containing layer. The first semiconductor layer has a first conductivity type. The first semiconductor layer is formed on a silicon substrate via a foundation layer and includes a nitride semiconductor. The light emitting part is provided on the first semiconductor layer. The light emitting part includes a plurality of barrier layers and a well layer provided between the barrier layers. The well layer includes $Ga_{1-z1}In_{z1}N$ ($0 < z1 \leq 1$).

The second semiconductor layer has a second conductivity type different from the first conductivity type. The second semiconductor layer is provided on the light emitting part and includes a nitride semiconductor. The In-containing layer is provided at at least one of first and second positions. The first position is between the first semiconductor layer and the light emitting part. The second position is between the second semiconductor layer and the light emitting part. The In-containing layer includes a nitride semiconductor containing In with an In composition ratio different from the In composition ratio z1 in the well layer and has a thickness not less than 10 nanometers and not more than 1000 nanometers.

According to another embodiment, a semiconductor light emitting device includes: a foundation layer, a first semiconductor layer, a light emitting part, and a second semiconductor layer. The foundation layer is provided on a silicon substrate. The first semiconductor layer has a first conductivity type. The first semiconductor layer is provided on the foundation layer and includes a nitride semiconductor. The light emitting part is provided on the first semiconductor layer. The light emitting part includes a plurality of barrier layers and a well layer provided between the barrier layers. The well layer includes $Ga_{1-z1}In_{z1}N$ ($0 < z1 \leq 1$). The second semiconductor layer has a second conductivity type different from the first conductivity type. The second semiconductor layer is provided on the light emitting part and includes a nitride semiconductor.

The foundation layer has a thickness not less than 2 nanometers and not more than 100 nanometers and includes an Al-containing layer including a nitride semiconductor containing Al. The Al-containing layer has an uneven part provided on an upper face of the Al-containing layer. A surface roughness Ra of the uneven part is not less than 1 nanometer and not more than 10 nanometers.

According to another embodiment, a nitride semiconductor wafer includes: a silicon substrate, a foundation layer, a first semiconductor layer, a light emitting part, a second semiconductor layer, and an In-containing layer. The foundation layer is provided on the silicon substrate. The first semiconductor layer has a first conductivity type. The first semiconductor layer is provided on the foundation layer and includes a nitride semiconductor. The light emitting part is provided on the first semiconductor layer. The light emitting part includes a plurality of barrier layers and a well layer provided between the plurality of barrier layers. The well layer includes $Ga_{1-z1}In_{z1}N$ ($0<z1\le1$). The second semiconductor layer has a second conductivity type different from the first conductivity type. The second semiconductor layer is provided on the light emitting part and includes a nitride semiconductor. The In-containing layer is provided at at least one of first and second positions. The first position is between the first semiconductor layer and the light emitting part. The second position is between the second semiconductor layer and the light emitting part. The In-containing layer includes a nitride semiconductor containing In with an In composition ratio different from the In composition ratio $z1$ in the well layer and has a thickness not less than 10 nanometers and not more than 1000 nanometers.

According to another embodiment, a nitride semiconductor wafer includes: a silicon substrate, a foundation layer, a first semiconductor layer, a light emitting part, and a second semiconductor layer. The foundation layer is provided on the silicon substrate. The first semiconductor layer has a first conductivity type. The first semiconductor layer is provided on the foundation layer and includes a nitride semiconductor. The light emitting part is provided on the first semiconductor layer. The light emitting part includes a plurality of barrier layers and a well layer provided between the barrier layers. The well layer includes $Ga_{1-z1}In_{z1}N$ ($0<z1\le1$). The second semiconductor layer has a second conductivity type different from the first conductivity type. The second semiconductor layer is provided on the light emitting part and includes a nitride semiconductor. The foundation layer has a thickness not less than 2 nanometers and not more than 100 nanometers and includes an Al-containing layer including a nitride semiconductor containing Al. The Al-containing layer has an uneven part provided on an upper face of the Al-containing layer. A surface roughness Ra of the uneven part is not less than 1 nanometer and not more than 10 nanometers.

According to another embodiment, a method for manufacturing a nitride semiconductor layer is disclosed. The method can form a first semiconductor layer of a first conductivity type including a nitride semiconductor on a foundation layer provided on a silicon substrate. The method can form, on the first semiconductor layer, a light emitting part including a plurality of barrier layers and a well layer provided between the barrier layers. The well layer includes $Ga_{1-z1}In_{z1}N$ ($0<z1\le1$). The method can form, on the light emitting part, a second semiconductor layer of a second conductivity type different from the first conductivity type. The second semiconductor layer includes a nitride semiconductor. In addition, the method can form an In-containing layer in a position at least one first and second positions. The first position is between the first semiconductor layer and the light emitting part. The second position is between the second semiconductor layer and the light emitting part. The In-containing layer includes a nitride semiconductor containing In with an In composition ratio different from the In composition ratio $z1$ included in the well layer and has a thickness not less than 10 nanometers and not more than 1000 nanometers.

According to another embodiment, a method for manufacturing a nitride semiconductor layer is disclosed. The method can form a foundation layer on a silicon substrate. The foundation layer has a thickness not less than 2 nanometers and not more than 100 nanometers and includes an Al-containing layer including a nitride semiconductor containing Al. The method can form, on the foundation layer, a first semiconductor layer of a first conductivity type including a nitride semiconductor. The method can form, on the first semiconductor layer, a light emitting part including a plurality of barrier layers and a well layer provided between the plurality of barrier layers. The well layer includes $Ga_{1-z1}In_{z1}N$ ($0<z1\le1$). In addition, the method can form, on the light emitting part, a second semiconductor layer of a second conductivity type different from the first conductivity type. The second semiconductor layer includes a nitride semiconductor. The Al-containing layer has an uneven part provided on an upper face of the Al-containing layer. A surface roughness Ra of the uneven part is not less than 1 nanometer and not more than 10 nanometers.

Exemplary embodiments of the invention will now be described in detail with reference to the drawings.

The drawings are schematic or conceptual; and the relationships between the thickness and width of portions, the proportions of sizes among portions, etc., are not necessarily the same as the actual values thereof. Further, the dimensions and proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

The embodiment relates to, for example, a semiconductor light emitting device such as a light emitting diode (LED) and a laser diode (LD).

FIG. 1 is a schematic cross-sectional view illustrating configuration of the semiconductor light emitting device according to the first embodiment.

As shown in FIG. 1, the semiconductor light emitting device 110 according to the embodiment includes a first semiconductor layer 10, a light emitting part 30, a second semiconductor layer 20 and an In-containing layer 60.

The first semiconductor layer 10 is formed on a silicon substrate 40 via a foundation layer 50. The first semiconductor layer 10 includes a nitride semiconductor and has a first conductivity type.

The light emitting part 30 is provided on the first semiconductor layer 10. The light emitting part 30 is provided, for example, on the side of a [0001] direction of the first semiconductor layer 10. An example of the light emitting part 30 will be described later.

The second semiconductor layer 20 is provided on the light emitting part 30. The second semiconductor layer 20 includes a nitride semiconductor and has a second conductivity type. The second conductivity type is different from the first conductivity type.

For example, the first conductivity type is n-type and the second conductivity type is p-type. Alternatively, the first conductivity type may be p-type and the second conductivity type may be n-type. Hereinafter, the description will be provided for the case that the first conductivity type is n-type and the second conductivity type is p-type.

The In-containing layer 60 is provided at at least one of first and second positions. The first position is between the first semiconductor layer 10 and the light emitting part 30. The second position is between the second semiconductor layer 20 and the light emitting part 30. In the example, the In-containing layer 60 is provided between the first semiconductor layer 10 and the light emitting part 30.

Here, a direction from the first semiconductor layer 10 toward the light emitting part 30 is defined as a Z-axis direction. An axis perpendicular to a Z-axis is defined as an X-axis. An axis perpendicular to the Z-axis and the X-axis is defined as a Y-axis.

The first semiconductor layer 10, light emitting part 30, the second semiconductor layer 20 and the In-containing layer 60, which are included in a function part 10s of the semiconductor light emitting device 110, are stacked along the Z-axis.

In the specification of the application, a term "stacked" means the case where both layers are stacked in contact with each other as well as the case where both layers are stacked with another layer being inserted therebetween. A phrase "provided on" means the case where both layers are provided in contact with each other as well as the case where both layers are provided with another layer being inserted therebetween.

The silicon substrate 40 is, for example, a Si (111) substrate. However, in the embodiment, the plane direction of the silicon substrate 40 is not necessarily a (111) face. The plane orientation direction of a major surface of the silicon substrate 40 (the surface on which the foundation layer 50 is formed) may be any of various plane orientation directions such as (111), (110) and (100) and faces inclined from the plane orientation directions.

The silicon substrate 40 may be removed (peeled) by any method after the function part 10s has been formed on the silicon substrate 40. A position where the silicon substrate 40 is peeled is, for example, within the foundation layer 50 or the function part 10s. Furthermore, at least a part of the silicon substrate 40 may be left.

Figure 2:
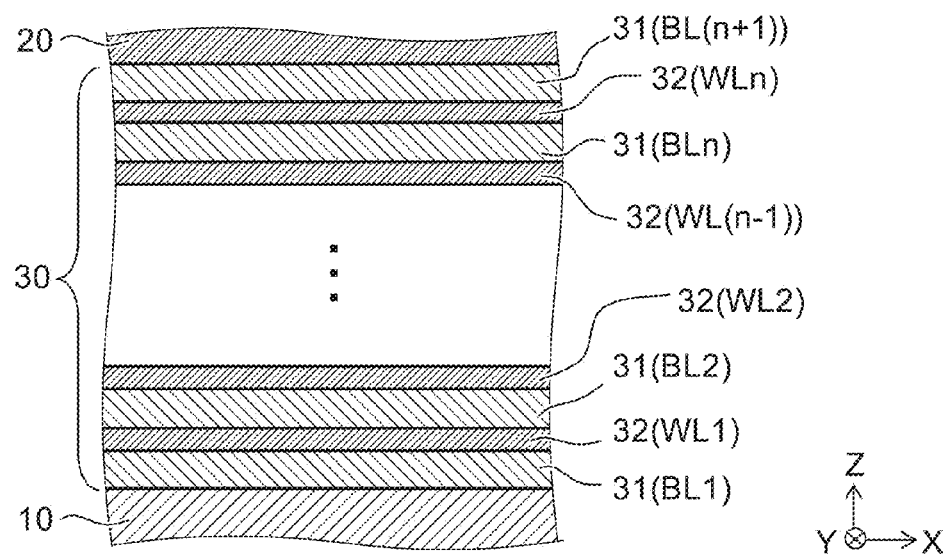
FIG. 2 is a schematic cross-sectional view showing a part of the semiconductor light emitting device according to the first embodiment.

FIG. 2 is a schematic cross-sectional view illustrating configuration of a part of the semiconductor light emitting device according to the first embodiment.

As shown in FIG. 2, the light emitting part 30 includes a plurality of barrier layers 31 and well layers 32 provided between the plurality of barrier layers 31. Each of the plurality of well layers 32 includes $Ga_{1-z1}In_{z1}N$ ($0<z1\leq1$). The barrier layers 31, include, for example, GaN. That is, the well layers 32 contain In and the barrier layers 31 do not contain In substantially. Alternatively, the barrier layers 31 contain In having a lower composition ratio than the In composition ratio of the well layers 32. Band gap energy of the barrier layers 31 is larger than that of the well layers 32.

For example, the plurality of barrier layers 31 and the plurality of well layer 32 are alternately stacked along the Z-axis.

The light emitting part 30 can have a Single Quantum Well (SQW) structure. At this time, the light emitting part 30 includes the two barrier layers 31 and the well layer 32 provided between the barrier layers 31. Alternatively, the light emitting part 30 can have a Multi Quantum Well (MQW) structure. At this time, the light emitting part 30 includes the three or more barrier layers 31 and the well layer 32 each provided between the barrier layers 31.

That is, the light emitting part 30 includes the (n+1) barrier layers 31 and n well layers 32 ("n" is an integer not less than two). The $(i+1)^{th}$ barrier layer BL(i+1) is positioned between the $i^{th}$ barrier layers BLi and the second semiconductor layer 20 ("i" is an integer not less than 1 and not more than (n-1)). The $(i+1)^{th}$ well layer WL(i+1) is positioned between the ith well layer WLi and the second semiconductor layer 20.

The first barrier layer BL1 is provided between the first semiconductor layer 10 and the first well layer WL1. The $n^{th}$ well layer WLn is provided between the nth barrier layer BLn and the $(n+1)^{th}$ barrier layer BL(n+1). The $(n+1)^{th}$ barrier layer BL(n+1) is provided between the nth well layer WLn and the second semiconductor layer 20.

For example, optical energy emitted from the light emitting part 30 is in a range not less than 0.4 electron volts (eV) and not more than 6.5 eV. For example, the peak wavelength of light emitted from the light emitting part 30 (emitted light) is not less than 380 nanometers (nm) and not more than 650 nm. However, in the embodiment, the peak wavelength is arbitrary.

The In-containing layer 60 includes a nitride semiconductor containing In with a composition ratio different from the In composition ratio z1 in the well layers 32. The In-containing layer 60 has a thickness not less than 10 nm and not more than 1000 nm.

Figure 3:
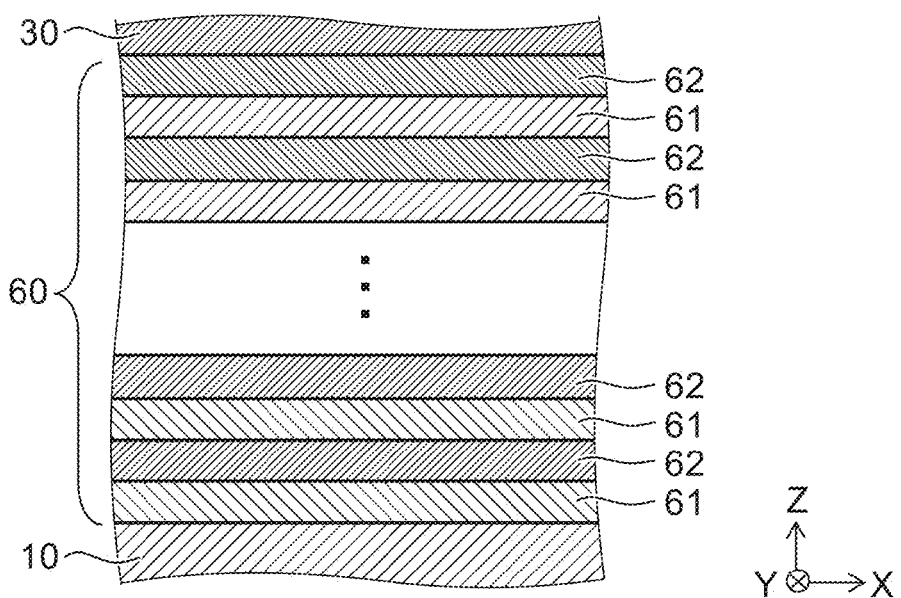
FIG. 3 is a schematic cross-sectional view showing a part of the semiconductor light emitting device according to the first embodiment.

FIG. 3 is a schematic cross-sectional view illustrating configuration of a part of the semiconductor light emitting device according to the first embodiment.

That is, this figure illustrates an example of the configuration of the In-containing layer 60.

As shown in FIG. 3, the In-containing layer 60 includes a plurality of first layers 61 and a plurality of second layers 62 which are alternately stacked. The first layers 61 include, for example, $Ga_{1-x2}In_{x2}N$ ($0<x2\leq1$). The second layers 62 include $Ga_{1-x3}In_{x3}N$ ($0\leq x3\leq1$, $x3<x2$).

For example, each of the number of the first layers 61 and the number of the second layers 62 (for example, the number of pairs) is, for example, 20. For example, an $In_{0.08}Ga_{0.92}N$ layer having a thickness of 1 nm is used as each of the first layers 61, and a GaN layer having a thickness of 3 nm is used as each of the second layers 62. The second layers 62 can contain n-type impurities.

The In-containing layer 60 is not necessarily a multilayered structure in which the plurality of layers is alternately stacked as described above. As described later, the In-containing layer 60 may be a single layer according to circumstances.

Figure 4:
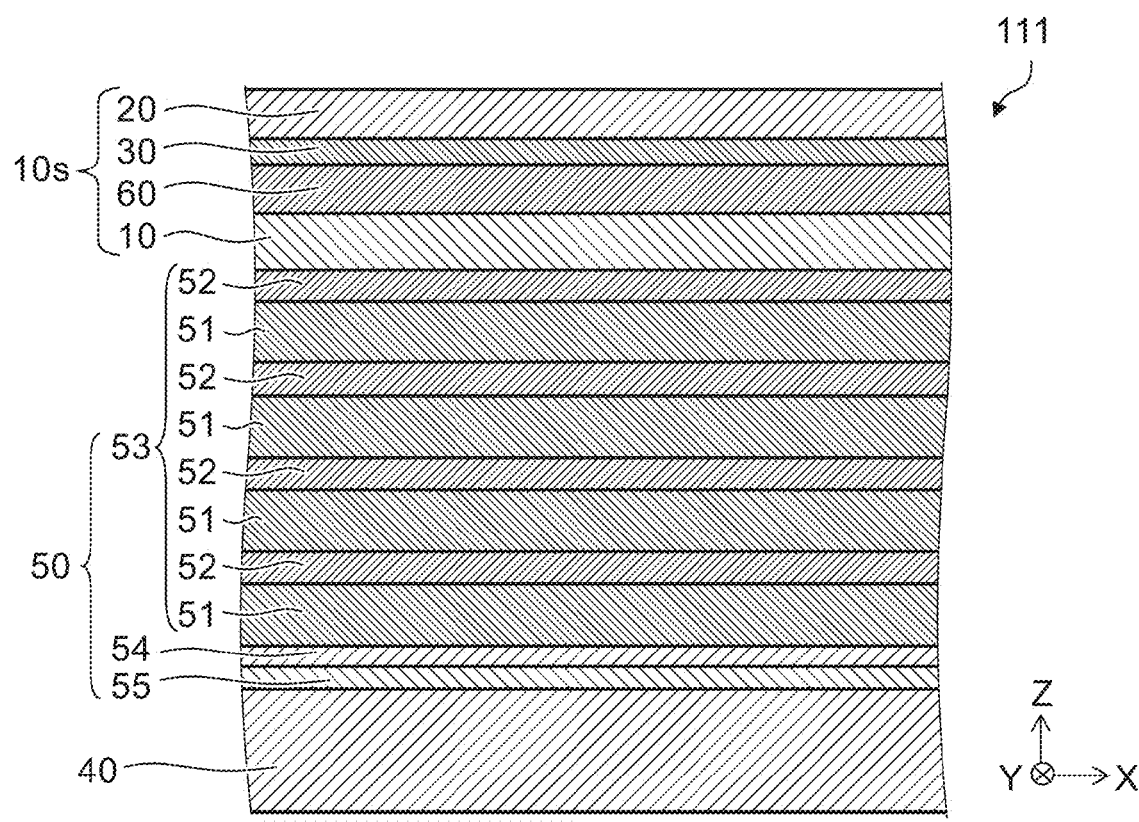
FIG. 4 is a schematic cross-sectional view showing a semiconductor light emitting device according to the first embodiment.

FIG. 4 is a schematic cross-sectional view illustrating configuration of a semiconductor light emitting device according to the first embodiment.

As shown in FIG. 4, in the semiconductor light emitting device 111 in a specific example according to the embodiment, the foundation layer 50 includes an AlN buffer layer 55 formed on the silicon substrate 40, an AlGaN buffer layer 54 formed on the AlN buffer layer 55 and a multilayered buffer layer 53 provided on the AlGaN buffer layer 54.

The multilayered buffer layer 53 includes a plurality of GaN layers 51 and a plurality of AlN layers 52 which are alternately stacked along the Z-axis.

The function part 10s is stacked on such foundation layer 50. In the example, the In-containing layer 60 has a multilayered structure having the first layers 61 and the second layers 62 as shown in FIG. 3.

By the semiconductor light emitting devices 110 and 111 according to the embodiment having such configuration, a semiconductor light emitting devices that suppress the deterioration and breakage of the semiconductor layer can be provided.

An evaluation result of characteristics of the fabricated semiconductor light emitting device 111 will be described below together with a reference example. The semiconductor light emitting device 111 was fabricated as follows.

Crystal growth of the semiconductor layer was achieved by using a MOVPE (Metal-Organic Vapor Phase Epitaxy) method.

First, the Si(111) silicon substrate 40 was cleaned by using a mixed solution of $H_2O_2$ and $H_2SO_4$ (1:1) for 13 minutes. Next, the silicon substrate 40 was cleaned by using 2% HF for minutes. After cleaning, the silicon substrate 40 was introduced into a MOVPE reactor.

The temperature of a susceptor was increased to 720° C. in a hydrogen atmosphere and TMA was supplied for eight seconds. After that, $NH_3$ was further supplied to form an AlN layer having a thickness of 40 nm, which serves as the AlN buffer layer 55.

Subsequently, the temperature of the susceptor was increased to 1030° C. to form an $Al_{0.25}Ga_{0.75}N$ layer having a thickness of 40 nm, which serves as the AlGaN buffer layer 54.

Next, the temperature of the susceptor was increased to 1080° C. to form a GaN layer having a thickness of 300 nm, which serves as the GaN layer 51.

Then, the temperature of the susceptor was decreased to 800° C. and an AlN layer having a thickness of 12 nm which serves as the AlN layer 52 was formed. A ratio of $NH_3$, $H_2$, and $N_2$ in the total flow was 20%, 80%, and 0%, respectively.

Furthermore, after the ratio of $NH_3$, $H_2$, and $N_2$ in the total flow was changed to 63%, 19%, and 18%, respectively, the temperature of the susceptor was increased to 1080° C. to alternately repeat three times the formation of a GaN layer having a thickness of 300 nm, which serves as the GaN layer 51 and the above-mentioned AlN layer 52.

Next, the temperature of the susceptor was decreased to 800° C. to form an AlN layer having a thickness of 12 nm and a ratio of $NH_3$, $H_2$, and $N_2$ in the total flow being 20%, 80%, and 0%, respectively, which serves as the AlN layer 52.

In this manner, the foundation layer 50 in which the plurality of GaN layers 51 and the plurality of AlN layers 52 were alternately stacked was formed.

Then, the temperature of the susceptor was increased to 1120° C. to form an n-type GaN layer having a thickness of 1.2 μm, which serves as the first semiconductor layer 10.

Subsequently, the temperature of the susceptor was decreased to 810° C. to alternately repeat 20 times the formation of an $In_{0.08}Ga_{0.92}N$ layer having a thickness of 1 nm, which serves as the first layer 61 and an n-type GaN layer having a thickness of 3 nm, which serves as the second layer 62. Thereby, the In-containing layer 60 was formed.

Next, the light emitting part 30 of the LED was formed. Furthermore, a p-type GaN layer which serves as the second semiconductor layer 20 was formed. Thereby, the semiconductor light emitting device 111 was formed.

In contrast, no In-containing layer 60 was provided in a semiconductor light emitting device 191 (not shown) of the first reference example. That is, the light emitting part 30 was formed in contact with the first semiconductor layer 10. Except for this, the semiconductor light emitting device 191 is the same as the semiconductor light emitting device 111.

The semiconductor light emitting device 111 according to the embodiment and the semiconductor light emitting device 191 of the first reference example, which were thus fabricated, were observed by means of a Nomarski microscope.

Figure 5A:
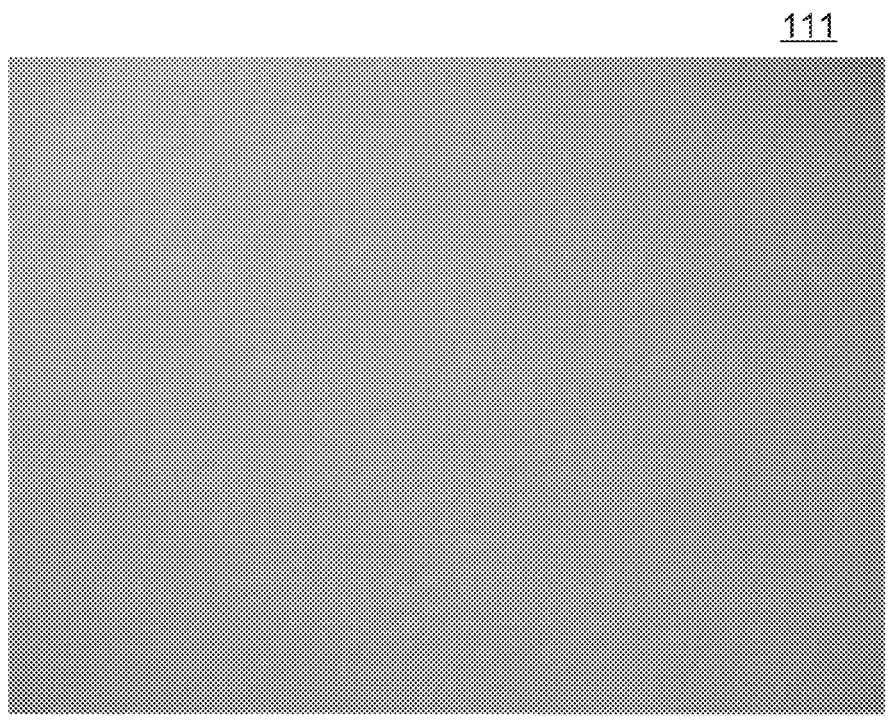
FIGS. 5A and 5B are Nomarski microscope images showing characteristics of the semiconductor light emitting devices.
Figure 5B:
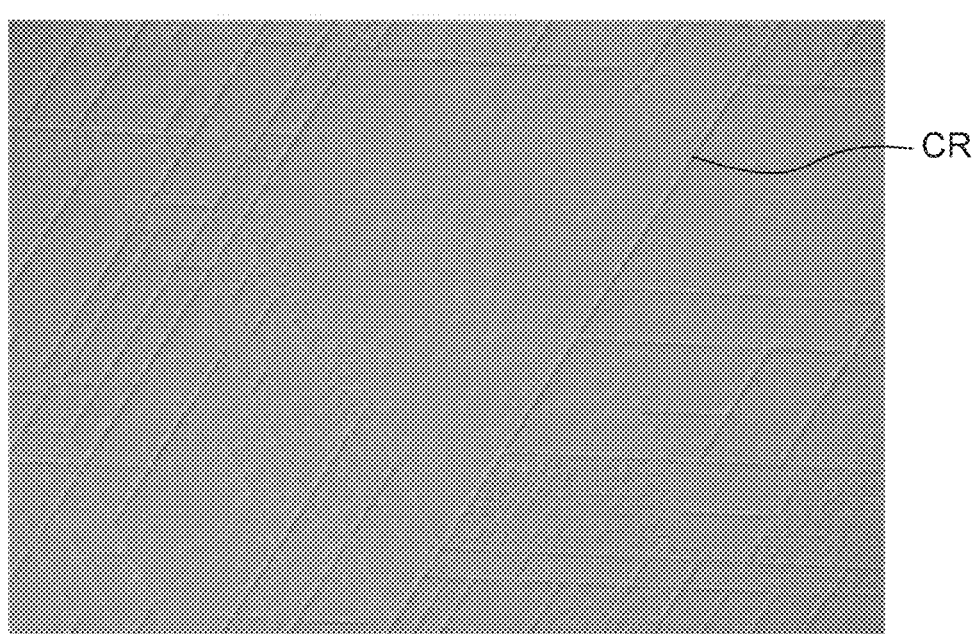

FIGS. 5A and 5B are Nomarski microscope images illustrating characteristics of the semiconductor light emitting devices.

As shown in FIG. 5A, in the semiconductor light emitting device 111 according to the embodiment, no crack was observed.

As shown in FIG. 5B, of the first reference example, many cracks CR were observed.

In this manner, in the embodiment, by providing the In-containing layer 60, no crack CR is substantially generated, thereby suppressing the deterioration and breakage of the semiconductor layer.

For example, when the semiconductor layer (for example, GaN layer) is formed on the substrate, a tensile stress is applied to the semiconductor layer due to difference in thermal expansion coefficient, and thus the substrate may protrude downward. As described above, when a stress is applied to the semiconductor layer, the crack CR is generated. In contrast to this, in certain configuration, a layer for adjusting stress is provided, and the substrate protrudes upward during growth of the semiconductor layer, and the substrate becomes flat when the temperature is returned to room temperature. However, in the configuration in which the nitride semiconductor layer is formed on the silicon substrate 40, it is found that only introduction of such layer for adjusting stress cannot substantially suppress the generation of the crack CR.

That is, for example, a lattice relaxation layer is used as the layer for adjusting stress. For this reason, dislocation becomes easily generated.

In contrast to this, the configuration according to the embodiment suppresses the generation of the crack CR as well as dislocation.

Figure 6:
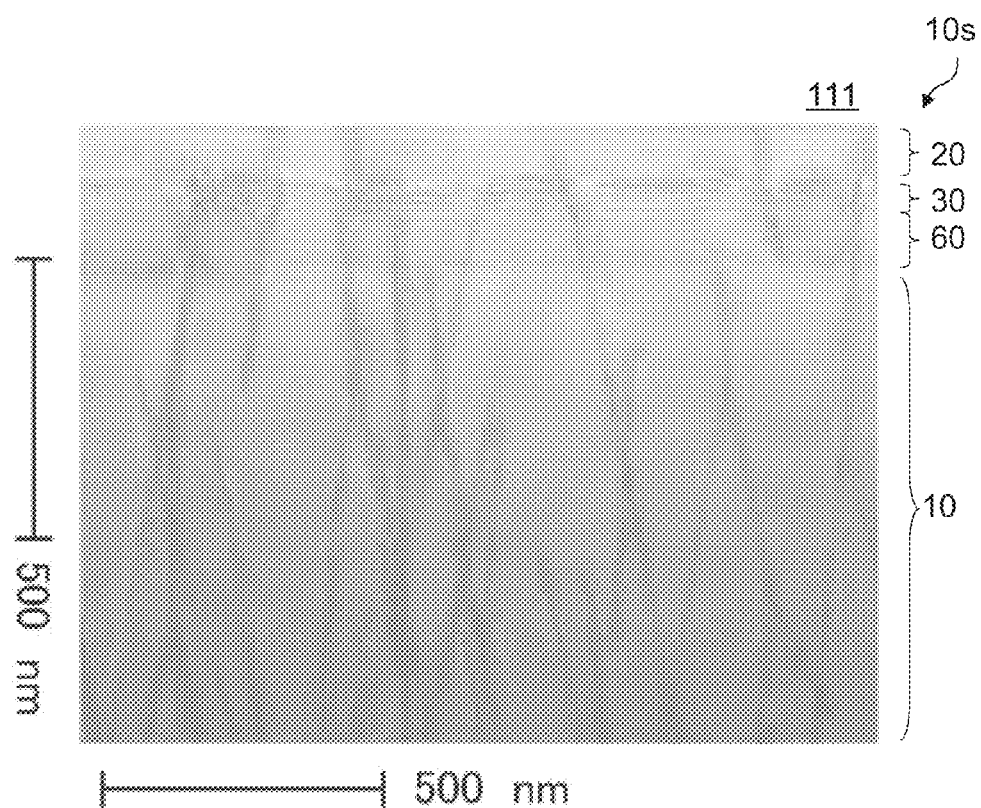
FIG. 6 is an electron microscope photograph showing characteristics of the semiconductor light emitting device according to the first embodiment.

FIG. 6 is an electron microscope photograph illustrating characteristics of the semiconductor light emitting device according to the first embodiment.

This figure is a transmission electron microscope photograph showing a cross section of the function part 10s of the semiconductor light emitting device 111. As can been seen from FIG. 6, dislocation is gradually reduced from the lower face of the first semiconductor layer 10 toward the upper face of the first semiconductor layer 10. As described above, the configuration according to the embodiment suppresses the generation of the crack CR as well as dislocation.

Figure 7A:
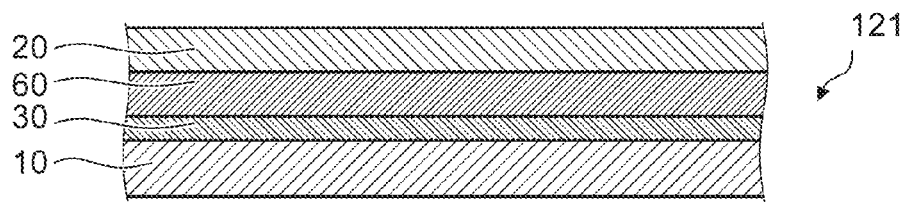
FIGS. 7A and 7B are schematic cross-sectional view showing other semiconductor light emitting devices according to the first embodiment.
Figure 7B:
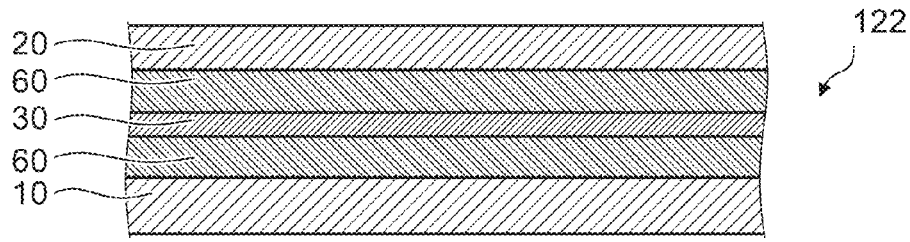

FIGS. 7A and 7B are schematic cross-sectional view illustrating configuration of another semiconductor light emitting device according to the first embodiment.

As shown in FIG. 7A, in the another semiconductor light emitting device 121 according to the embodiment, the In-containing layer 60 is provided between the second semiconductor layer 20 and the light emitting part 30.

As shown in FIG. 7B, in another semiconductor light emitting device 122 according to the embodiment, the In-containing layer 60 is provided between the first semiconductor layer 10 and the light emitting part 30, and between the second semiconductor layer 20 and the light emitting part 30.

For example, in the semiconductor light emitting devices 110, 121 and 122, a $Ga_{1-x1}In_{x1}N$ layer ($0<x1\leq1$) can be used as the In-containing layer 60. The In-containing layer 60 may be a single layer.

Furthermore, in the case where the In-containing layer 60 includes a plurality of first layers 61 and a plurality of second layers 62 which are alternately stacked as shown in FIG. 3, the In-containing layer 60 can be provided at at least of one of first and second positions. The first position is between the first semiconductor layer 10 and the light emitting part 30. The second position is between the second semiconductor layer 20 and the light emitting part 30.

Figure 8A:
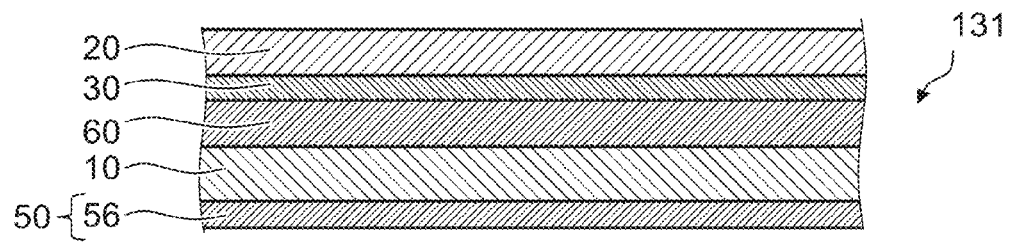
FIGS. 8A and 8B are schematic cross-sectional views showing other semiconductor light emitting devices according to the first embodiment.
Figure 8B:
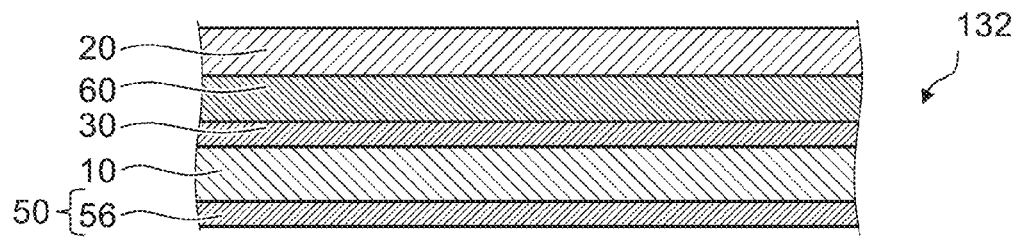

FIGS. 8A and 8B are schematic cross-sectional views illustrating configuration of other semiconductor light emitting devices according to the first embodiment.

As shown in FIGS. 8A and 8B, in other semiconductor light emitting devices 131 and 132 according to the embodiment, the foundation layer 50 includes an Al-containing layer 56. The Al-containing layer 56 includes a nitride semiconductor containing Al. The Al-containing layer 56 may further contain at least one of B or In. The Al-containing layer 56 includes, for example, $Ga_{1-y1}Al_{y1}N$ ($0<y1\leq1$). The Al-containing layer 56 has a thickness not less than 2 nm and not more than 100 nm.

In the case where the Al-containing layer 56 is provided in the same way as in the semiconductor light emitting devices 131 and 132, the In-containing layer 60 can be provided at at least one of first and second positions. The first position is between the first semiconductor layer 10 and the light emitting part 30. The second position is between the second semiconductor layer 20 and the light emitting part 30.

Moreover, in the case where the In-containing layer 60 includes the plurality of first layers 61 and the plurality of second layers 62 which are alternately stacked, the Al-containing layer 56 may be provided.

The thickness of each layer included in the semiconductor light emitting device can be obtained from an electron microscope photograph of a cross section of each layer. The concentration of elements contained in each layer, such as In and Al, can be obtained from analysis results of TEM-EDX (transmission electron microscope-energy dispersive X-ray spectroscopy), SIMS (secondary ion mass spectrometry) and the like.

Second Embodiment

Figure 9:
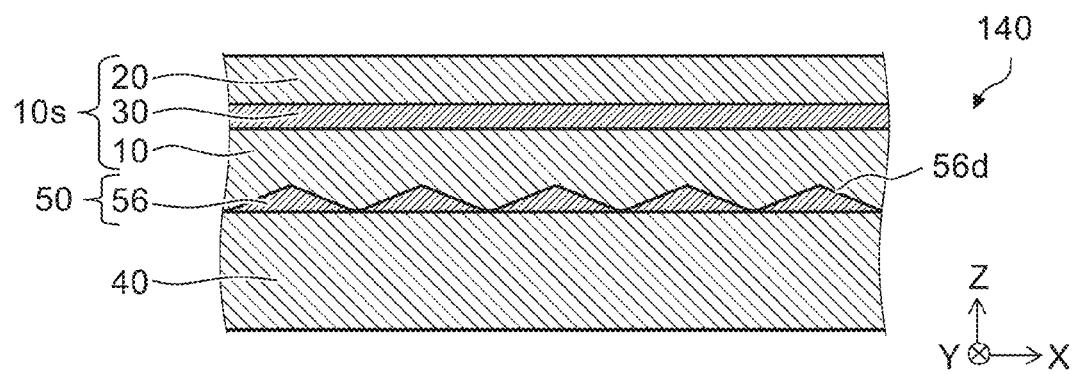
FIG. 9 is a schematic cross-sectional view showing a semiconductor light emitting device according to a second embodiment.

FIG. 9 is a schematic cross-sectional view illustrating configuration of a semiconductor light emitting device according to a second embodiment.

As shown in FIG. 9, the semiconductor light emitting device 140 according to the embodiment includes the foundation layer 50 formed on the silicon substrate 40, the first semiconductor layer 10 of the first conductivity type which is provided on the foundation layer 50 and which includes a nitride semiconductor, the light emitting part 30 provided on the first semiconductor layer 10, and the second semiconductor layer 20 of the second conductivity type which is provided on the light emitting part 30 and which includes a nitride semiconductor. Also in this case, the light emitting part 30 includes the plurality of barrier layers 31 and the well layer 32 which is provided between the plurality of barrier layers 31 and which includes $Ga_{1-z1}In_{z1}N$ ($0<z1\leq1$).

The foundation layer 50 has a thickness not less than 2 nm and not more than 100 nm and includes the Al-containing layer 56 including a nitride semiconductor containing Al. The Al-containing layer 56 has an uneven part 56d provided on an upper face of the Al-containing layer 56 (a face on a side of the first semiconductor layer 10). A surface roughness Ra of the uneven part 56d is not less than 1 nm and not more than 10 nm. For example, the surface roughness Ra is about 3 nm.

With such configuration, the semiconductor light emitting device with suppressed deterioration and breakage of the semiconductor layer can be obtained.

Figure 10:
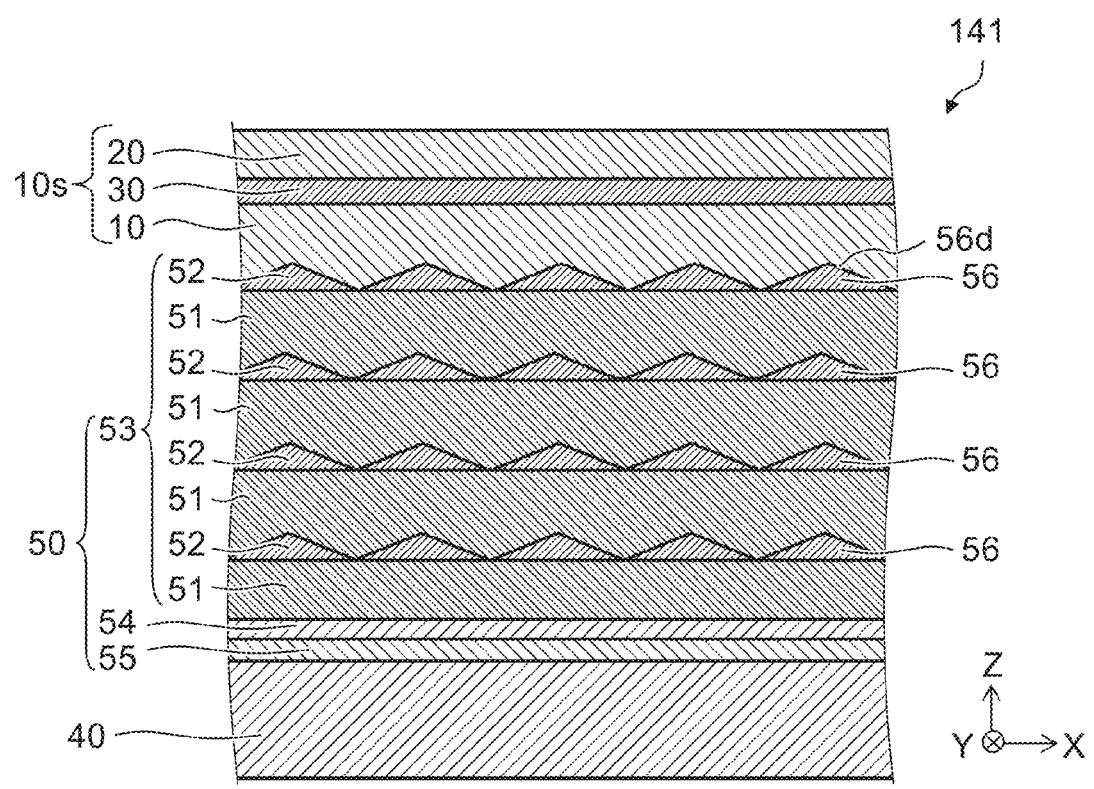
FIG. 10 is a schematic cross-sectional view showing another semiconductor light emitting device according to the second embodiment.

FIG. 10 is a schematic cross-sectional view illustrating configuration of another semiconductor light emitting device according to the second embodiment.

As shown in FIG. 10, in the semiconductor light emitting device 141 in a specific example according to the embodiment, the AlN buffer layer 55 and the AlGaN buffer layer 54 which are described with reference to FIG. 4 are formed and the multilayered buffer layer 53 is provided thereon. The multilayered buffer layer 53 includes the plurality of GaN layers 51 and the plurality of AlN layers 52 which are alternately stacked along the Z-axis.

In the example, the AlN layers 52 each have the uneven part 56d provided on a face (the upper face) on the side of the first semiconductor layer 10. That is, the AlN layer 52 corresponds to the Al-containing layer 56 having the uneven part 56d.

No In-containing layer 60 is provided in the semiconductor light emitting device 141. Other configuration is the same as that of the semiconductor light emitting device 111, and thus description thereof is omitted.

An evaluation result of characteristics of the fabricated semiconductor light emitting device 141 will be described below with a reference example. The semiconductor light emitting device 141 was fabricated as follows.

Crystal growth of the semiconductor layer was achieved according to the MOVPE (Metal-Organic Vapor Phase Epitaxy) method.

First, the Si (111) silicon substrate 40 was cleaned by using a mixed solution of $H_2O_2$ and $H_2SO_4$ (1:1) for 13 minutes. Next, the silicon substrate 40 was cleaned by using 2% HF for minutes. After cleaning, the silicon substrate 40 was introduced into the MOVPE reactor.

The temperature of a susceptor was increased to 720° C. in a hydrogen atmosphere and TMA was supplied for eight seconds. After that, $NH_3$ was further supplied to form an AlN layer having a thickness of 40 nm, which serves as the AlN buffer layer 55.

Subsequently, the temperature of the susceptor was increased to 1030° C. to form an $Al_{0.25}Ga_{0.75}N$ layer having a thickness of 40 nm, which serves as the AlGaN buffer layer 54.

Next, the temperature of the susceptor was increased to 1080° C. to form a GaN layer having a thickness of 300 nm, which serves as the GaN layer 51.

Then, the temperature of the susceptor is decreased to 800° C. to form an AlN layer having a thickness of 12 nm and a ratio of $NH_3$, $H_2$, and $N_2$ in the total flow being 20%, 80%, and 0%, respectively, which serves as the AlN layer 52.

Furthermore, after the ratio of $NH_3$, $H_2$, and $N_2$ in the total flow is changed to 32%, 52%, and 16%, respectively, the temperature of the susceptor was increased to 1120° C. to form a GaN layer having a thickness of 300 nm, which serves as the GaN layer 51. Formation of the AlN layer 52 and formation of the GaN layer 51 are alternately repeated three times.

Next, the temperature of the susceptor was decreased to 800° C. to form an AlN layer having a thickness of 12 nm and a ratio of $NH_3$, $H_2$, and $N_2$ in the total flow being 20%, 80%, and 0%, respectively, which serves as the AlN layer 52. Thereby, the multilayered buffer layer 53 was formed.

Under the above-mentioned conditions, the uneven part 56d was formed on the AlN layer 52. That is, the AlN layer 52 was formed in a dotted configuration. The surface roughness Ra of the uneven part 56d was about 3 nm.

After that, the first semiconductor layer 10 was formed, the light emitting part 30 was formed without forming the In-containing layer 60, and the second semiconductor layer 20 was formed. Thereby, the semiconductor light emitting device 141 was formed.

In contrast, in a semiconductor light emitting device 182 (not shown) of a second reference example, formation conditions of the multilayered buffer layer 53 were set to be same as the conditions in the semiconductor light emitting device 111. In this case, the AlN layer 52 had no uneven part 56d and thus, the upper face of the AlN layer 52 was substantially flat. Then, first semiconductor layer 10, the light emitting part 30, and the second semiconductor layer 20 were formed without forming the In-containing layer 60.

The semiconductor light emitting device 141 according to the embodiment and the semiconductor light emitting device 192 of the second reference example, which were thus fabricated, were observed by means of the Nomarski microscope.

Figure 11A:
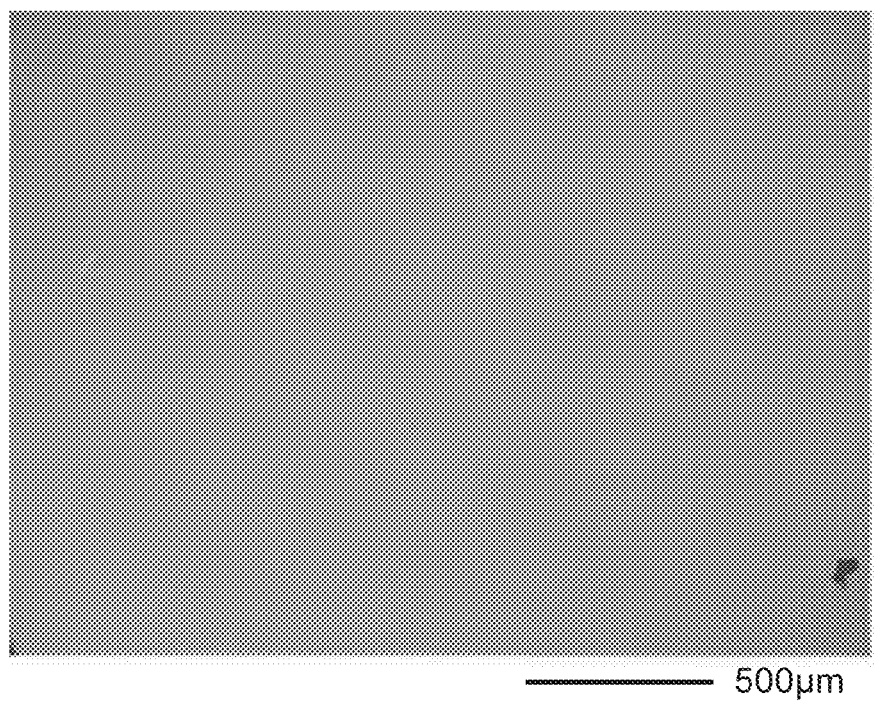
FIGS. 11A and 11B are Nomarski microscope images showing characteristics of the semiconductor light emitting devices.
Figure 11B:
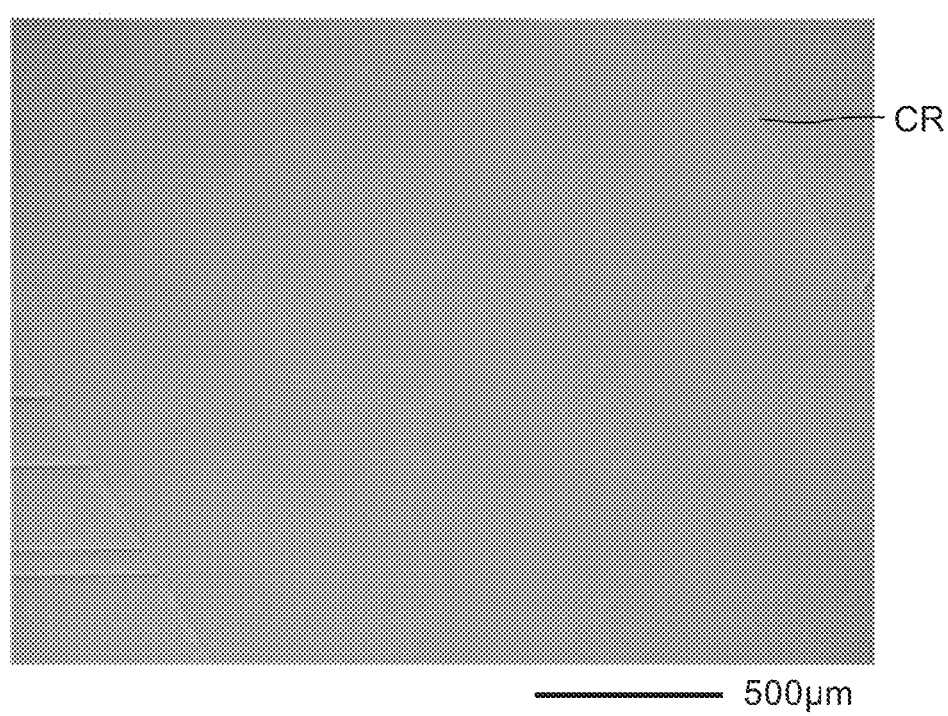

FIGS. 11A and 11B are Nomarski microscope images illustrating characteristics of the semiconductor light emitting devices.

As shown in FIG. 11A, in the semiconductor light emitting device 141 according to the embodiment, no crack was observed.

As shown in FIG. 11B, of the second reference example, many cracks CR were observed.

As described above, in the embodiment, by providing the Al-containing layers 56 (the AlN layers 52) each having the uneven part 56d in the foundation layer 50, the generation of the crack CR can be suppressed very effectively. As in this example, in the case of using the Al-containing layer 56 having the uneven part 56d, even if the In-containing layer 60 described according to the first embodiment is not provided, the generation of the crack CR can be suppressed. However, the In-containing layer 60 and the Al-containing layer 56 may be provided. This further makes it difficult to generate the crack CR.

Figure 12A:
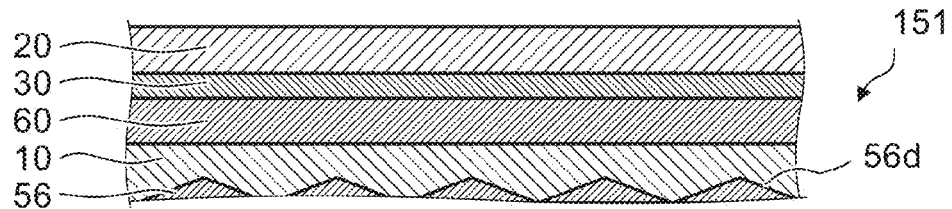
FIGS. 12A and 12B are schematic cross-sectional views showing other semiconductor light emitting devices according to the second embodiment.
Figure 12B:
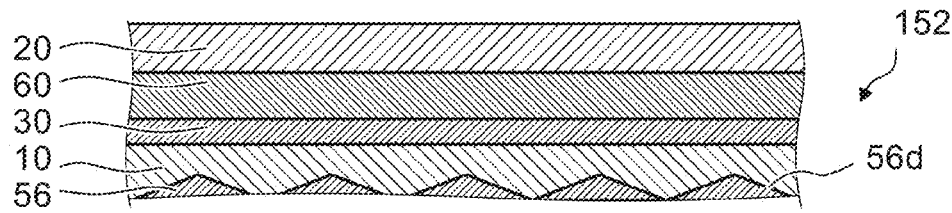

FIGS. 12A and 12B are schematic cross-sectional views illustrating configuration of other semiconductor light emitting devices according to the second embodiment.

As shown in FIG. 12A, in the semiconductor light emitting device 151 according to the embodiment, the In-containing layer 60 is provided between the first semiconductor layer 10 and the light emitting part 30, and further the Al-containing layer 56 having the uneven part 56d is provided.

As shown in FIG. 12B, in the semiconductor light emitting device 152 according to the embodiment, the In-containing layer 60 is provided between the second semiconductor layer 20 and the light emitting part 30, and further the Al-containing layer 56 having the uneven part 56d is provided.

Alternatively, while the Al-containing layer 56 having the uneven part 56d is further provided, the In-containing layer 60 may be provided between the first semiconductor layer 10 and the light emitting part 30, and between the second semiconductor layer 20 and the light emitting part 30.

A layer including GaN layer (in this example, the GaN layer 51 in the multilayered buffer layer 53) is provided under the Al-containing layer 56 having the uneven part 56d (in this example, the AlN layer 52 in the multilayered buffer layer 53), which is effective in suppressing the deterioration and breakage of the semiconductor layer.

The Al-containing layer 56 having the uneven part 56d may be provided in the foundation layer 50 and at any position on the foundation layer 50. Furthermore, although the Al-containing layers 56 having the uneven part 56d (the AlN layers 52) and the layers including GaN (the GaN layers 51) are alternately stacked in the semiconductor light emitting device 141, one Al-containing layer 56 having the uneven part 56d (for example, one pair) may be provided.

Third Embodiment

Figure 13A:
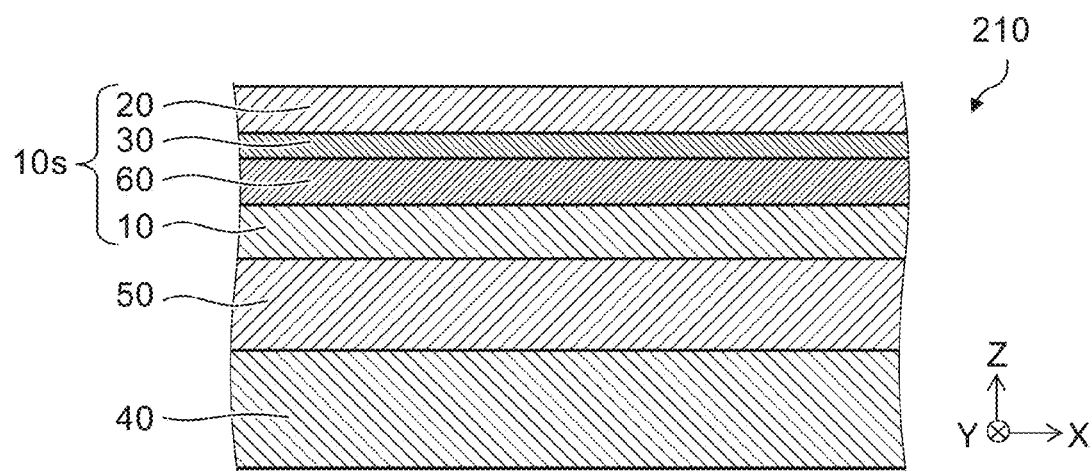
FIGS. 13A and 13B are schematic cross-sectional view showing nitride semiconductor wafers according to a third embodiment.
Figure 13B:
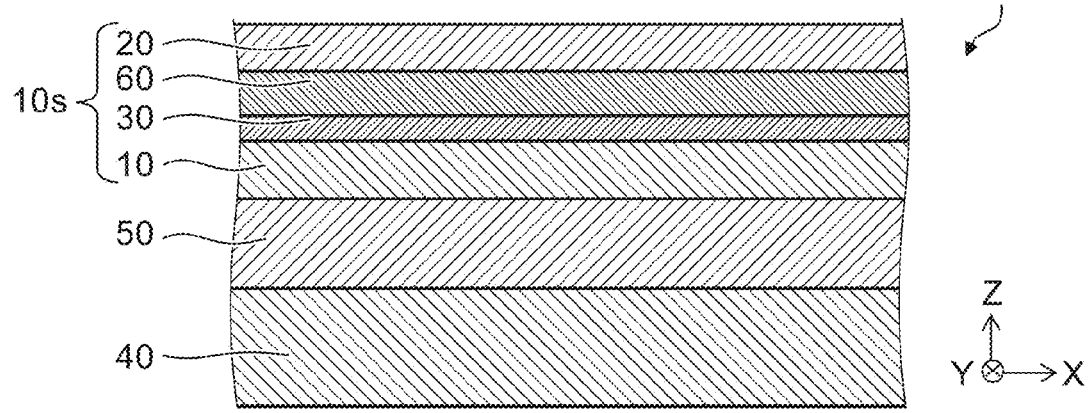

FIGS. 13A and 13B are schematic cross-sectional view illustrating configuration of nitride semiconductor wafers according to a third embodiment.

As shown in FIGS. 13A and 13B, the nitride semiconductor wafers 210 and 211 according to the embodiment each include the silicon substrate 40, the foundation layer 50 provided on the silicon substrate 40, the first semiconductor layer 10 of the first conductivity type which is provided on the foundation layer 50 and which includes a nitride semiconductor, the light emitting part 30 provided on the first semiconductor layer 10, the second semiconductor layer 20 of the second conductivity type which is provided on the light emitting part 30 and which includes a nitride semiconductor, and the In-containing layer 60.

The light emitting part 30 includes the plurality of barrier layers 31 and the well layer 32 which is provided between the plurality of barrier layers 31 and which includes $Ga_{1-z1}In_{z1}N$ ($0<z1\le1$).

In the nitride semiconductor wafer 210, the In-containing layer 60 is provided between the first semiconductor layer 10 and the light emitting part 30. In the nitride semiconductor wafer 211, the In-containing layer 60 is provided between the second semiconductor layer 20 and the light emitting part 30.

The In-containing layer 60 may be provided between the first semiconductor layer 10 and the light emitting part 30, and between the second semiconductor layer 20 and the light emitting part 30.

The In-containing layer 60 includes a nitride semiconductor containing In with a composition ratio that is different from the In composition ratio $z1$ in the well layer 32. The In-containing layer 60 has a thickness not less than 10 nm and not more than 1000 nm.

Figure 14:
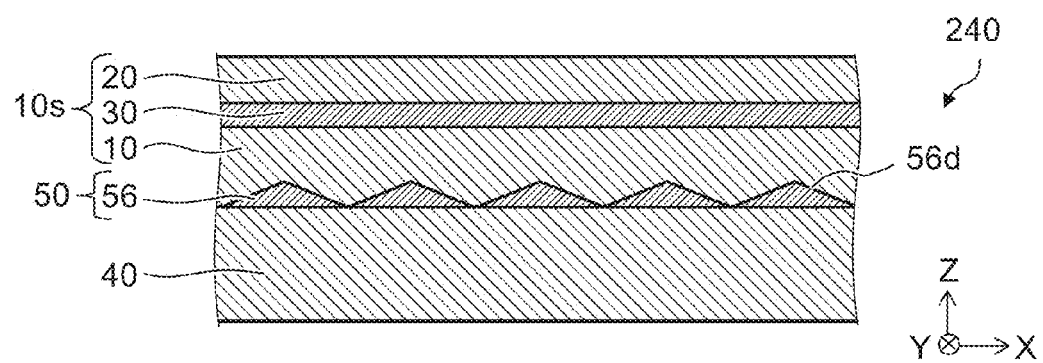
FIG. 14 is a schematic cross-sectional view showing another nitride semiconductor wafer according to the third embodiment.

FIG. 14 is a schematic cross-sectional view illustrating configuration of another nitride semiconductor wafer according to the third embodiment.

As shown in FIG. 14, the another nitride semiconductor wafer 240 according to the embodiment includes the silicon substrate 40, the foundation layer 50 provided on the silicon substrate 40, the first semiconductor layer 10 of the first conductivity type which is provided on the foundation layer 50 and which includes a nitride semiconductor, the light emitting part 30 provided on the first semiconductor layer 10, and the second semiconductor layer 20 of the second conductivity type which is provided on the light emitting part 30 and which includes a nitride semiconductor. The light emitting part 30 includes the plurality of barrier layers 31 and the well layer 32 which is provided between the plurality of barrier layers 31 and which includes $Ga_{1-z1}In_{z1}N$ ($0<z1\le1$).

The foundation layer 50 has a thickness not less than 2 nm and not more than 100 nm and includes the Al-containing layer 56 including the nitride semiconductor containing Al. The Al-containing layer 56 has the uneven part 56d provided on the upper face of the Al-containing layer 56 (the face on the side of the first semiconductor layer 10). A surface roughness Ra of the uneven part 56d is not less than 1 nm and not more than 10 nm.

The nitride semiconductor wafers 210, 211 and 240 can provide the nitride semiconductor wafers for the semiconductor light emitting device with suppressed deterioration and breakage of the semiconductor layer.

In the nitride semiconductor wafers according to the embodiment, the In-containing layer 60 can include the plurality of first layers 61 including $Ga_{1-x2}In_{x2}N$ ($0<x2\leq1$) and the plurality of second layers 62 including $Ga_{1-x3}In_{x3}N$ ($0\leq x3\leq1$, $x3<x2$) which are alternately stacked.

The foundation layer 50 can include the Al-containing layer 56 including the nitride semiconductor containing Al. It is preferred that the thickness of the Al-containing layer 56 is not less than 2 nm and not more than 100 nm.

The Al-containing layer 56 can have the uneven part 56d provided on the upper face of the Al-containing layer 56 (the face on the side of the first semiconductor layer 10). The surface roughness Ra of the uneven part 56 is not less than 1 nm and not more than 10 nm.

Fourth Embodiment

Figure 15A:
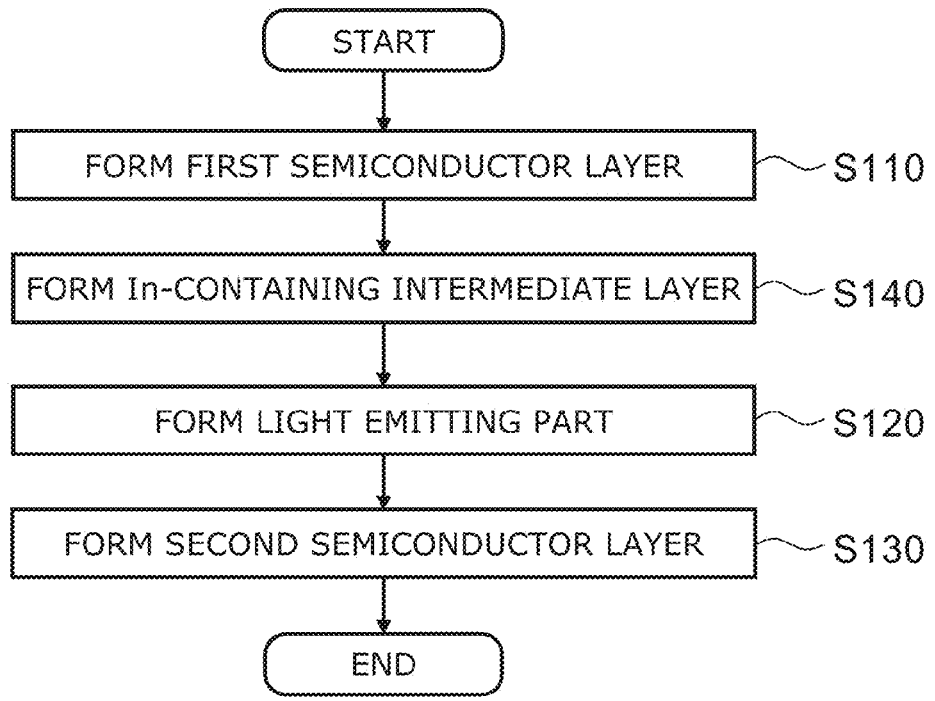
FIGS. 15A and 15B are flow charts showing a method for manufacturing the nitride semiconductor layer according to a fourth embodiment.
Figure 15B:
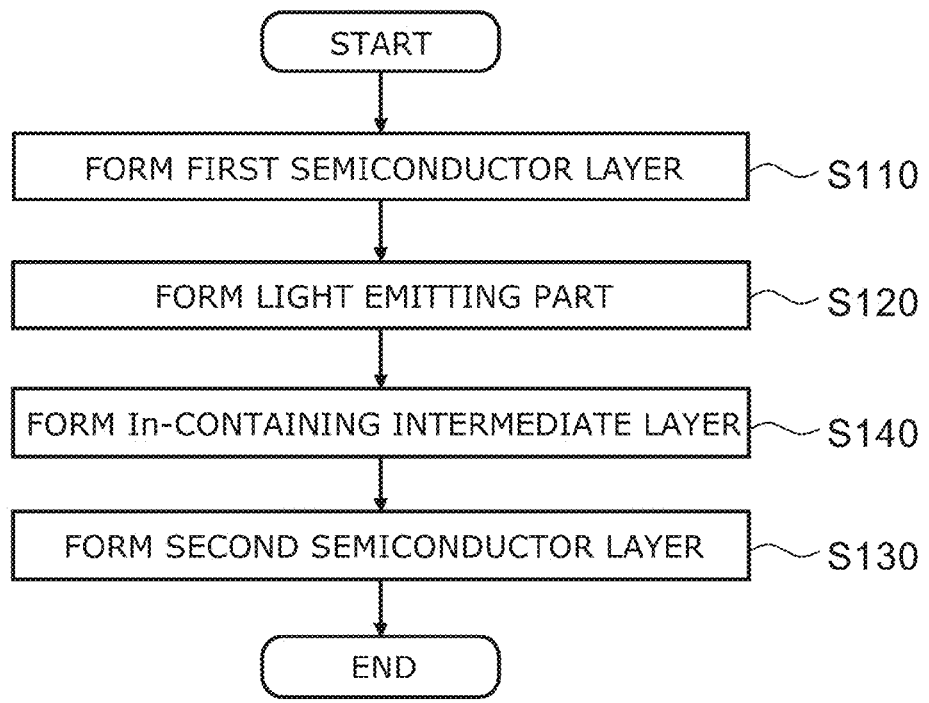

FIGS. 15A and 15B are flow charts illustrating a method for manufacturing the nitride semiconductor layer according to a fourth embodiment.

As shown in FIGS. 15A and 15B, the method for manufacturing the nitride semiconductor layer according to the embodiment includes forming the first semiconductor layer 10 of the first conductivity type including a nitride semiconductor on the foundation layer 50 provided on the silicon substrate 40 (Step S110).

The manufacturing method further includes forming the light emitting part 30 including the plurality of barrier layers 31 and the well layer 32 which is positioned between the plurality of barrier layers 31 and which includes $Ga_{1-z1}In_{z1}N$ ($0<z1\leq1$) on the first semiconductor layer 10 (Step S120).

The manufacturing method further includes forming the second semiconductor layer 20 of a second conductivity type which is different from the first conductivity type and which includes a nitride semiconductor, on the light emitting part 30 (Step S130).

The manufacturing method further includes forming the In-containing layer 60 in a position at least one of first and second positions (Step S140). The first position is between the first semiconductor layer 10 and the light emitting part 30. The second position is between the second semiconductor layer and the light emitting part 30. The In-containing layer 60 includes the nitride semiconductor containing In with a composition ratio that is different from the In composition ratio z1 in the well layer 32. In-containing layer 60 has a thickness not less than 10 nm and not more than 1000 nm.

Figure 16:
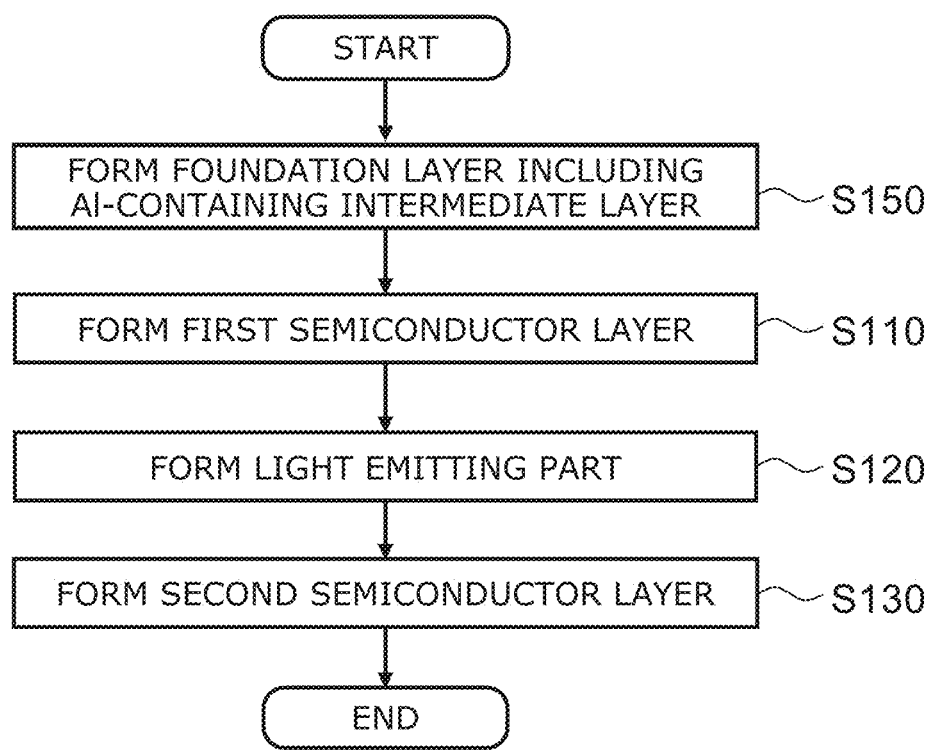
FIG. 16 is a flow chart showing another method for manufacturing the nitride semiconductor layer according to the fourth embodiment.

FIG. 16 is a flow chart illustrating another method for manufacturing the nitride semiconductor layer according to the fourth embodiment.

As shown in FIG. 16, the method for manufacturing the nitride semiconductor layer according to the embodiment includes forming the foundation layer 50 including the Al-containing layer 56 on the silicon substrate 40 (Step S150). The Al-containing layer 56 has a thickness not less than 2 nm and not more than 100 nm and includes a nitride semiconductor containing Al.

The manufacturing method further includes forming the first semiconductor layer 10 of the first conductivity type including a nitride semiconductor on the foundation layer 50 (Step S110).

The manufacturing method further includes forming the light emitting part 30 including the plurality of barrier layers 31 and the well layer 32 which is positioned between the plurality of barrier layers 31 and which includes $Ga_{1-z1}In_{z1}N$ ($0<z1\leq1$) on the first semiconductor layer 10 (Step S120).

The manufacturing method further includes forming the second semiconductor layer 20 of the second conductivity type which is different from the first conductivity type, and which includes a nitride semiconductor, on the light emitting part 30 (Step S130).

The Al-containing layer 56 has the uneven part 56d provided on the face on the side of the first semiconductor layer 10 (the upper face of the Al-containing layer 56) and the surface roughness Ra of the uneven part 56d is not less than 1 nm and not more than 10 nm.

According to the manufacturing method described with reference to FIGS. 15A, 15B and 16, the nitride semiconductor layer with suppressed deterioration and breakage can be manufactured.

In the embodiment, for growth of the semiconductor layer, for example, a Metal-Organic Chemical Vapor Deposition (MOCVD) method, a Metal-Organic Vapor Phase Epitaxy (MOVPE) method, a Molecular Beam Epitaxy (MBE) method and a Halide Vapor Phase Epitaxy (HVPE) method can be employed.

For example, in the case of employing the MOCVD method or the MOVPE method, in forming each semiconductor layer, following materials can be adopted. For example, TMGa (trimethyl gallium) and TEGa (triethyl gallium) can be used as a raw material for Ga. For example, TMIn (trimethyl indium) and TEIn (triethyl indium) can be used as a raw material for In. For example, TMAl (trimethyl aluminum) can be used as a raw material for Al. For example, $NH_3$ (ammonia), MMHy (monomethyl hydrazine) and DMHy (dimethyl hydrazine) can be used as a raw material for N. $SiH_4$ (monosilane) and $Si_2H_6$ (disilane) can be used as a raw material for Si.

According to the embodiments, the semiconductor light emitting device, the nitride semiconductor wafer and the method for manufacturing the nitride semiconductor layer, which suppress the deterioration and breakage of the semiconductor layer, can be provided.

In the specification, "nitride semiconductor" includes all compositions of semiconductors of the chemical formula $B_xIn_yAl_zGa_{1-x-y-z}N$ ($0\leq x\leq1$, $0\leq y\leq1$, $0\leq z\leq1$, and $x+y+z\leq1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to the specific examples. However, the invention is not limited to these specific examples. For example, one skilled in the art may similarly practice the invention by appropriately selecting specific configurations of component included in substrates included in nitride semiconductor devices and wafers, AlN buffer layers, AlGaN buffer layers, foundation layers, multilayered buffer layers, AlN layers, GaN layers, In-containing layers, Al-containing layers, semiconductor layers and light emitting parts, etc., from known art. Such practice is included in the scope of the invention to the extent that similar effects thereto are obtained.

Further, any two or more components of the specific examples may be combined within the extent of technical feasibility and are included in the scope of the embodiments to the extent that the spirit of the embodiments is included.

Moreover, all nitride semiconductor devices, nitride semiconductor wafers and manufacturing methods of nitride semiconductor layers practicable by an appropriate design modification by one skilled in the art based on the nitride semiconductor devices, nitride semiconductor wafers and manufacturing methods of nitride semiconductor layers described above as embodiments of the invention also are within the scope of the invention to the extent that the purport of the embodiments of the invention is included.

Furthermore, various modifications and alterations within the spirit of the invention will be readily apparent to those skilled in the art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a foundation layer; and
   a first semiconductor layer of a first conductivity type, the first semiconductor layer being provided on the foundation layer and including a nitride semiconductor, wherein
   the foundation layer includes a multilayered buffer layer provided on a silicon substrate,
   the multilayered buffer layer includes a plurality of GaN layers and a plurality of AlN layers, the plurality of GaN layers and the plurality of AlN layers being alternately stacked,
   each of the plurality of AlN layers has an uneven part provided on an upper face thereof, and
   at least a part of at least one of the plurality of AlN layers has a dotted configuration through an entire thickness of the at least one of the plurality of AlN layers.

2. The device according to claim 1, wherein the foundation layer includes:
   an AlN buffer layer formed on the silicon substrate,
   an AlGaN buffer layer formed on the AlN buffer layer, and
   the multilayered buffer layer provided on the AlGaN buffer layer.

3. The device according to claim 1, wherein a surface roughness Ra of the uneven part is not less than 1 nanometer and not more than 10 nanometers.

4. The device according to claim 1, wherein:
   the foundation layer further includes:
   an AlN buffer layer provided on the silicon substrate,
   an Al GaN buffer layer provided on the AlN buffer layer, and
   a GaN layer provided on the AlGaN buffer layer; and
   the multilayered buffer layer is provided on the GaN layer.

5. The device according to claim 1, wherein each of the plurality of AlN layers has a thickness that is not less than 2 nanometers and not more than 100 nanometers.

6. The device according to claim 1, further comprising:
   a light emitting part provided on the first semiconductor layer, the light emitting part including a plurality of barrier layers and a well layer provided between the barrier layers, the well layer including $Ga_{1-z1}In_{z1}N$ ($0<z1\leq1$); and
   a second semiconductor layer of a second conductivity type different from the first conductivity type, the second semiconductor layer being provided on the light emitting part and including a nitride semiconductor.

7. The device according to claim 6, wherein a peak wavelength of light emitted from the light emitting part is not less than 380 nanometers and not more than 650 nanometers.

8. The device according to claim 6, further comprising:
   an In-containing layer provided at least one of first and second positions,
   the first position being between the first semiconductor layer and the light emitting part,
   the second position being between the second semiconductor layer and the light emitting part, and
   the In-containing layer including a nitride semiconductor containing In with an In composition ratio different from the In composition ratio z1 in the well layer and having a thickness not less than 10 nanometers and not more than 1000 nanometers.

9. The device according to claim 8, wherein the In-containing layer includes:
   a plurality of first layers including $Ga_{1-X2}In_{X2}N$ ($0<X2\leq1$), and
   a plurality of second layers including $Ga_{1-X3}In_{X3}N$ ($0\leq X3\leq1$, $X3<X2$), the first layers and the second layers being alternately stacked.

10. A nitride semiconductor wafer comprising:
    a silicon substrate;
    a foundation layer provided on the silicon substrate; and
    a first semiconductor layer of a first conductivity type, the first semiconductor layer being provided on the foundation layer and including a nitride semiconductor, wherein
    the foundation layer includes a multilayered buffer layer provided on the silicon substrate,
    the multilayered buffer layer includes a plurality of GaN layers and a plurality of AlN layers, the plurality of GaN layers and the plurality of AlN layers being alternately stacked,
    each of the plurality of the AlN layers has an uneven part provided on an upper face thereof, and
    at least a part of at least one of the plurality of AlN layers has a dotted configuration through an entire thickness of the at least one of the plurality of AlN layers.

11. The wafer according to claim 10, wherein a surface roughness Ra of the uneven part is not less than 1 nanometer and not more than 10 nanometers.

12. The wafer according to claim 10, wherein:
    the foundation layer further includes:
    an AlN buffer layer provided on the silicon substrate,
    an AlGaN buffer layer provided on the AlN buffer layer, and
    a GaN layer provided on the AlGaN buffer layer; and
    the multilayered buffer layer is provided on the GaN layer.

13. The wafer according to claim 10, wherein each of the plurality of AlN layers has a thickness that is not less than 2 nanometers and not more than 100 nanometers.

14. The wafer according to claim 10, further comprising:
a light emitting part provided on the first semiconductor layer, the light emitting part including a plurality of barrier layers and a well layer provided between the barrier layers, the well layer including $Ga_{1-z1}In_{z1}N$ ($0<z1\leq1$); and
a second semiconductor layer of a second conductivity type different from the first conductivity type, the second semiconductor layer being provided on the light emitting part and including a nitride semiconductor.

15. The wafer according to claim 14, further comprising:
an In-containing layer provided at least one of first and second positions,
the first position being between the first semiconductor layer and the light emitting part,
the second position being between the second semiconductor layer and the light emitting part, and
the In-containing layer including a nitride semiconductor containing In with an In composition ratio different from the In composition ratio z1 in the well layer and having a thickness not less than 10 nanometers and not more than 1000 nanometers.

16. The wafer according to claim 15, wherein the In-containing layer includes:
a plurality of first layers including $Ga_{1-X2}In_{X2}N$ ($0<X2\leq1$), and
a plurality of second layers including $Ga_{1-X3}In_{X3}N$ ($0\leq X3\leq1$, $X3<X2$), the first layers and the second layers being alternately stacked.

17. A method for manufacturing a nitride semiconductor layer comprising:
forming a foundation layer on a silicon substrate, the foundation layer including an a multilayered buffer layer provided on the silicon substrate; and
forming, on the foundation layer, a first semiconductor layer of a first conductivity type including a nitride semiconductor, wherein
the multilayered buffer layer includes a plurality of GaN layers and a plurality of AlN layers, the plurality of GaN layers and the plurality of AlN layers being alternately stacked,
each of plurality of the AlN layers has an uneven part provided on an upper face thereof, and
at least a part of at least one of the plurality of AlN layers has a dotted configuration through an entire thickness of the at least one of the plurality of AlN layers.

18. The method according to claim 17, wherein:
the forming the foundation layer further includes:
forming an AlN buffer layer on the silicon substrate,
forming an AlGaN buffer layer on the AlN buffer layer, and
forming a GaN layer on the AlGaN buffer layer; and
the forming the multilayered buffer layer includes forming the multilayered buffer layer on the GaN layer.

19. The method according to claim 17, wherein a surface roughness Ra of the uneven part is not less than 1 nanometer and not more than 10 nanometers.

20. The method according to claim 17, wherein each of the plurality of AlN layers has a thickness that is not less than 2 nanometers and not more than 100 nanometers.

21. The method according to claim 17, further comprising:
forming, on the first semiconductor layer, a light emitting part including a plurality of barrier layers and a well layer provided between the plurality of barrier layers, the well layer including $Ga_{1-z1}In_{z1}N$ ($0<z1\leq1$); and
forming, on the light emitting part, a second semiconductor layer of a second conductivity type different from the first conductivity type, the second semiconductor layer including a nitride semiconductor.

22. The method according to claim 21, further comprising:
forming an In-containing layer provided at least one of first and second positions, the first position being between the first semiconductor layer and the light emitting part,
the second position being between the second semiconductor layer and the light emitting part, and
the In-containing layer including a nitride semiconductor containing In with an In composition ratio different from the In composition ratio z1 in the well layer and having a thickness not less than 10 nanometers and not more than 1000 nanometers.

23. The method according to claim 22, wherein the In-containing layer includes:
a plurality of first layers including $Ga_{1-X2}In_{X2}N$ ($0<X2\leq1$), and
a plurality of second layers including $Ga_{1-X3}In_{X3}N$ ($0\leq X3\leq1$, $X3<X2$), the first layers and the second layers being alternately stacked.

* * * * *